United States Patent [19]

Yester, Jr.

[11] 4,168,507

[45] Sep. 18, 1979

[54] STRUCTURE AND TECHNIQUE FOR ACHIEVING REDUCED INDUCTIVE EFFECT OF UNDESIRED COMPONENTS OF COMMON LEAD INDUCTANCE IN A SEMICONDUCTIVE RF POWER PACKAGE

[75] Inventor: Francis R. Yester, Jr., Mt. Prospect, Ill.

[73] Assignee: Motorola, Inc., Schaumburg, Ill.

[21] Appl. No.: 853,702

[22] Filed: Nov. 21, 1977

[51] Int. Cl.² ............................................ H01L 27/02
[52] U.S. Cl. ...................................... 357/51; 357/68; 357/80
[58] Field of Search ............................. 357/80, 68, 51

[56] References Cited

U.S. PATENT DOCUMENTS

| | | | |
|---|---|---|---|
| 3,825,805 | 7/1974 | Belohoubeck et al. | 357/80 |
| 3,969,752 | 7/1976 | Martin et al. | 357/80 |
| 4,042,952 | 8/1977 | Kraybill | 357/80 |

Primary Examiner—Edward J. Wojciechowicz
Attorney, Agent, or Firm—James W. Gillman; Victor Myer

[57] ABSTRACT

An RF power transistor device, or package, which includes a transistor, a capacitor, an electrically insulating but thermally conducting substrate, a metallic ground lead member on the substrate having input output and common portions, a heat sink on which the substrate is mounted and, input and output microstrip conductor means mounted on the heat sink has the common lead inductive effect of at least one component of common lead inductance of the transistor reduced by tightly coupling the input ground current and the input current as by a film of dielectric material such as Kapton or Teflon of about one half mil in thickness. Alternatively the output current and the output ground current may be tightly coupled.

2 Claims, 10 Drawing Figures

U.S. Patent  Sep. 18, 1979  Sheet 1 of 3  4,168,507
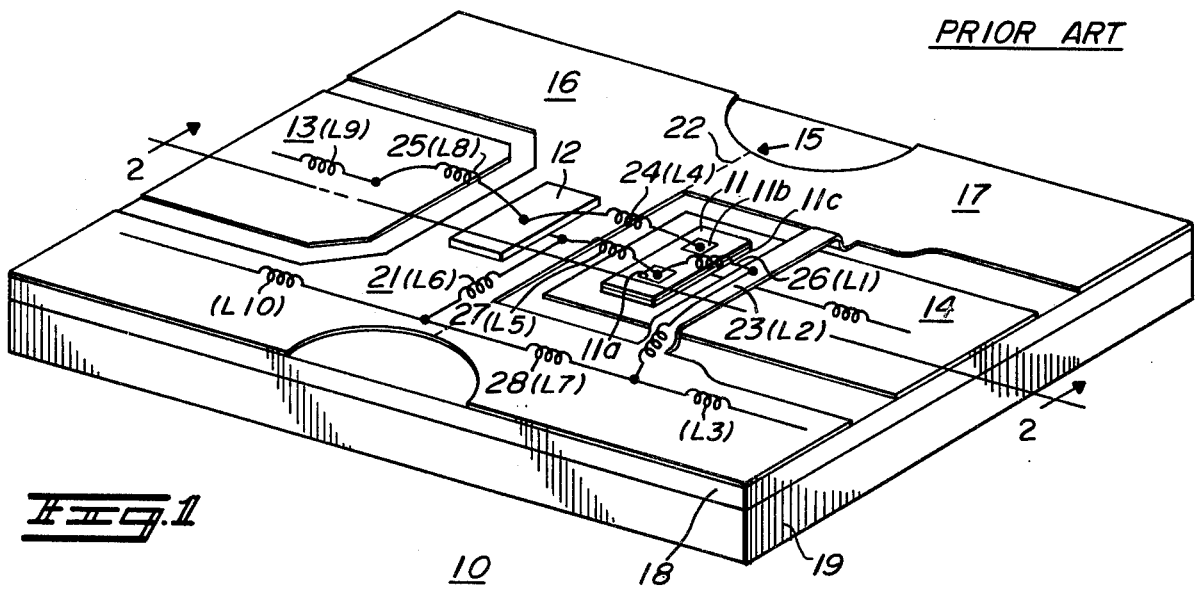
Fig.1  PRIOR ART
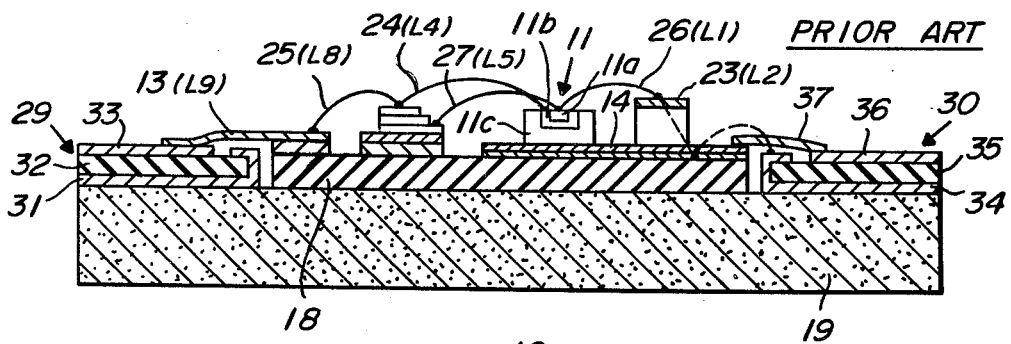
Fig.2  PRIOR ART
Fig.3

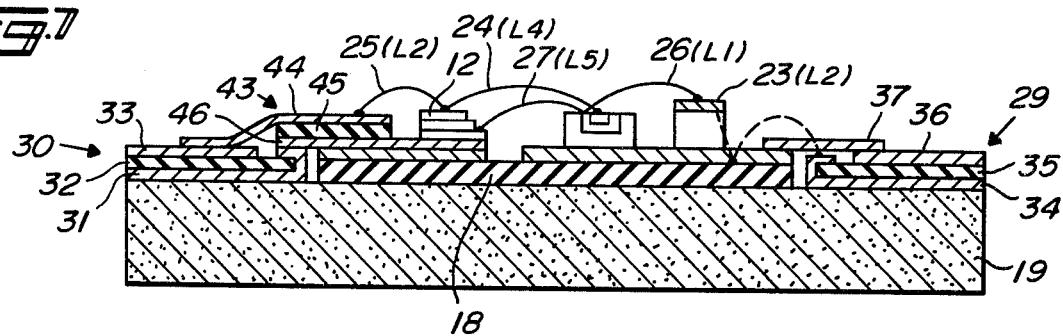
FIG. 7
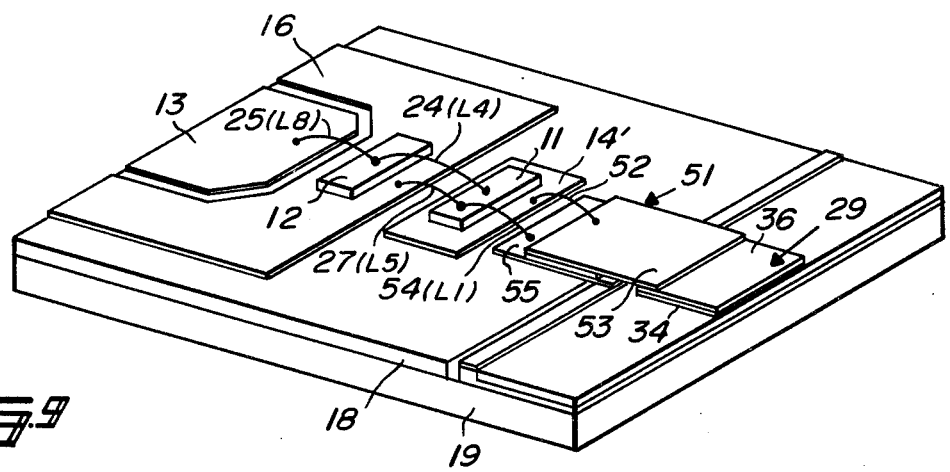
FIG. 9
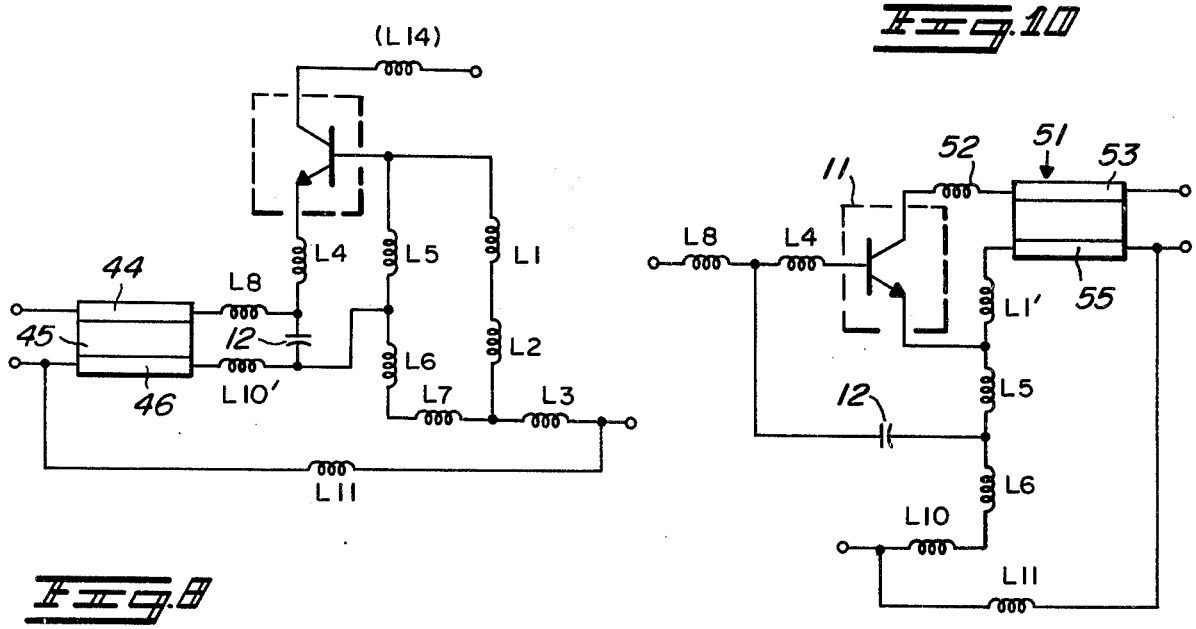
FIG. 8
FIG. 10

STRUCTURE AND TECHNIQUE FOR ACHIEVING REDUCED INDUCTIVE EFFECT OF UNDESIRED COMPONENTS OF COMMON LEAD INDUCTANCE IN A SEMICONDUCTIVE RF POWER PACKAGE

BACKGROUND OF THE INVENTION

This invention relates to high frequency, high power, semiconductive hybrid devices, or packages, wherein the undesired effects of particular components of common lead inductance are minimized, if not eliminated.

Typical examples of such prior art high frequency power transistor devices are shown in the U.S. Pat. Nos. 3,387,190 June 4, 1968, Winkler, 3,609,480, Sept. 28, 1971 Gerstner, 3,713,006 Jan. 23, 1973 Litty et al, 3,864,727 Feb. 4, 1975 Schoeberel, 3,996,603 Dec. 7, 1976 Smith and 4,042,952 Aug. 16, 1977 Kraybill.

In all of these devices the objectives tend to be the same which are those of eliminating, modifying or controlling in some way or other the common lead inductance of the transistor at the frequency desired and over a wide frequency band at appropriately high power levels. Constant and improved gain and improved input impedance are sought.

While the invention will be described in connection with bipolar transistor hybrid devices or packages, this is by way of example only, inasmuch as the invention may have application in appropriate instances to MosFets, or JFets or other semiconductive devices in similar configurations. When the expression transistor is utilized in this specification, it is intended to mean any of the foregoing stated devices.

Hybrid RF power, semiconductive devices, or packages, are well-known in the art. Typically such devices or packages include a transistor and an input capacitor mounted upon appropriately metallized surfaces of a beryllia substrate including a lead frame arrangement bonded to the metallized areas which includes input, output and ground portions or members. Appropriate wire bonds extend from the active portions of the transistor and capacitor to the various lead portions as is well understood. Such hybrid devices, or packages, may be characterized as having an input circuit and output circuit and a common circuit which includes common lead inductance.

The beryllia substrate is electrically insulating but thermally conducting and is usually mounted upon a relatively massive metallic heat sink. Appropriate ground connections may be made to the grounded heat sink. To complicate such structure further the input and output circuits usually comprise microstrip conductor means which include a metallic strip mounted on an insulating substrate whose impedances are matched to those of the input and output circuits of the transistor. In addition, the microstrip circuit devices may also be grounded to the metallic heat sink, for example, by wrap around metallizations.

All of these components must be considered to have their effect in the circuit in which the transistor is operating and as a practical matter reflect some part into the common lead inductance of the transistor circuit.

It is evident that the circuit approach is desirable to determine which component of the transistor, lead frame, metallizations, capacitor, substrate, heat sink and input and output microstrip conductors must be modified in order to achieve the optimum from a standpoint of minimizing the effects of the common lead inductance. The circuit approach to the problem is typified by the aforesaid U.S. Pat. Nos. to Litty et al 3,713,006 and Kraybill, 4,042,952. While in these examples of the prior art substantial progress has been achieved in minimizing the effects of the common leads inductance, all of the effects have not been eliminated particularly at the higher power levels and at the higher frequencies, for example, in the range of 400 mHz to one or more gHz.

SUMMARY OF THE INVENTION

It is an object of the invention to provide an improved RF power hybrid transistor device, or package, embodying improved reductions in the common lead inductance.

It is a further object of the invention for providing a technique for reducing the inductive effect of, at least, one component of common lead inductance in device of the nature indicated.

In the instance wherein the transistor is operated in the common base mode and the parasitic effects of microstrip ground planes over the heat sink can be ignored, the common lead inductive effect of that portion of the ground lead conductor associated with the input capacitor can be eliminated, in accordance with the invention, by conducting the input ground current away from the ground terminal of the capacitor in an in line manner instead of laterally through the ground lead conductor. This may be achieved by an appropriate gap in the ground lead conductor and metallization and the provision of appropriate wire bonds or by making the input ground inductance of the device very small such as by closely coupling the input ground current to the input current as by two very closely spaced conductors separated by a very thin film of dielectric material. For example, two metallic conductors separated by a piece of dielectric material such as Kapton or Teflon of about one half mil in thickness. This same aspect of the invention will also eliminate the common lead inductive effects of the parasitic aspects of the microstrip ground planes over the heat sink. In the case of a transistor operated in the common emitter mode, the common lead inductive effect may be minimized by reducing the inductive effect of the output ground conductor to a low value by closely coupling the output ground current to the output current as by coupling these two currents closely by using thin film conductors separated by a very thin dielectric material such as Kapton or Teflon of about one half mil in thickness.

Power transistors comprehend wattages of about one to 100 watts, for example, for single devices.

BRIEF DESCRIPTION OF THE DRAWINGS

FIG. 1 is a perspective view, partially schematic, of prior art devices of the nature to which the subject invention applies.

FIG. 2 is a sectional view of the device shown in FIG. 1 including some additional structure;

FIG. 3 is a circuit diagram of the structure shown in FIGS. 1 and 2.

FIG. 7 is a sectional view of the structure shown in FIG. 6.

FIG. 8 is a circuit diagram of the structure shown in FIGS. 6 and 7.

FIG. 9 is a diagrammatic view of structure of a modified form of the invention; and FIG. 10 is a circuit diagram applicable to the structure of FIG. 9.

DESCRIPTION OF THE PREFERRED EMBODIMENTS OF THE INVENTION

Figure 4:
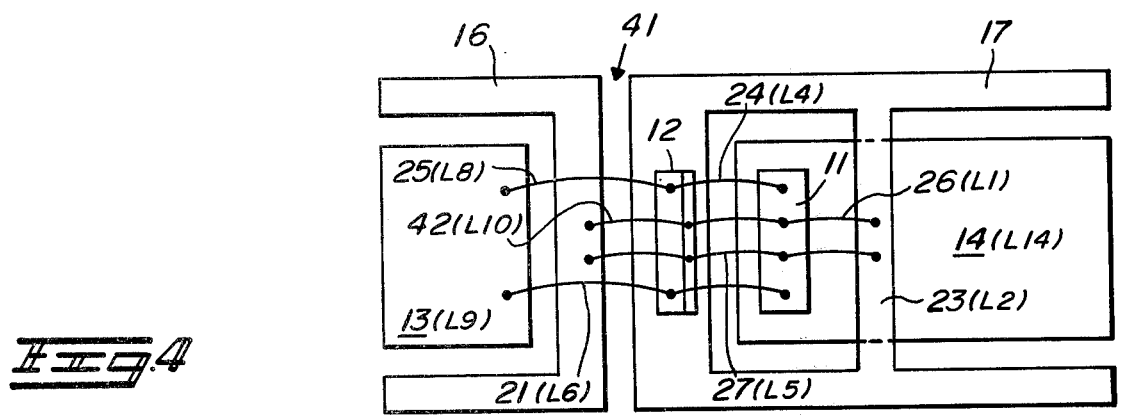
FIG. 4 is a diagrammatic view of structure according to one form of the invention.

FIGS. 1, 2 and 3 may be considered together inasmuch as they represent a typical prior art structure with the various components being illustrated somewhat diagrammatically. The general similiarity, at least, to the prior art patent structures referred to above will be apparent, for example, by noting the Kraybill U.S. Pat. No. 4,042,952 and the Litty et al U.S. Pat. No. 3,713,006.

The RF power transistor device 10 of FIGS. 1, 2 and 3 is shown comprising a transistor chip 11 and an MOS capacitor 12, an input lead member 13, an output member lead 14 and a ground lead member 15 having an input ground lead portion 16 and an output ground lead portion 17 mounted appropriately as shown on a dielectric substrate 18 which, for example, may be beryllia, which in turn is mounted on a metallic heat sink 19. Appropriate metallizations, not shown, exist on the surfaces of the beryllia substrate 18 in order that the various lead members may be bonded thereto as is well understood in this art.

The transistor chip 11 may include the usual active areas for example, emitter 11a, base 11b and collector 11c of which the emitter and base may be subdivided, and the collector 11c may be bonded to the output lead 14. The capacitor 12 which may be an MOS capacitor is bonded with one of its terminals to a metallic ground member 21 which is part of the input ground member 16 and, in effect, lies between the input ground member 16 and the output ground member 17 as shown by the dotted line 22. The location of the dotted line 22 dividing the input ground conductor 16 from the output ground conductor 17 on FIG. 1 is relatively arbitrary. The input ground lead 16 and the output ground lead 17 are each divided into two parts one part of each lying on the opposite sides, respectively, of the input lead member 13 and output lead member 14. Connecting the two separated parts of the output ground lead 17 is the bridge member 23.

The transistor chip 11 is shown connected in the common emitter mode, although this is by way of example, as it may be connected in the common base mode as well, as will become clear in this specification, and the input to the base 11b is through wire bonds of 24 of which only one is shown between the base 11b and one terminal of the capacitor 12. From that same terminal of the capacitor, there are input wire bonds 25 of which only one is shown extending to the input lead 13. The emitter 11a of transistor chip 11 is connected, typically, by means of wire bonds 26 (only one being shown) extending to the bridge 23 and from the emitter through wire bonds 27 (only one being shown) extending to the ground lead 21 which also is to say to the ground terminal of the MOS capacitor 12.

In FIG. 1, the inductances associated with each of the various leads and metallization members are shown. Thus, the wire bonds 26 extending from the emitter portions of the transistor chip 11 to the bridge 23 comprise an inductance $L_1$, the inductance of the bridge 23 to the output ground member 17 comprises inductance $L_2$, the inductance of the output ground lead is $L_3$, the inductance of the wire bonds 24 from the base 11b to the input terminal of capacitor 12 is $L_4$, the inductance of the leads 27 from the emitter 11a of capacitor 11 to the ground terminal of MOS capacitor 12 and also the ground lead portion 21 is $L_5$, the inductance of the ground lead portion 21 is shown as $L_6$, and the inductance of the ground lead portion 28 between the ground lead portion 21 and the bridge member 23 which may be designated as the inductance between the input ground lead portion and the output ground lead portion is designated as $L_7$, the inductance of the wire bonds 25 extending from the input terminal of the MOS capacitor 12 to the base input lead 13 is designated as $L_8$, the inductance of the input or base lead is designated as $L_9$ and the inductance of the input ground lead portion 16 is designated as $L_{10}$.

Referring to FIG. 2 which is, in effect, a sectional view of the hybrid transistor device shown in FIG. 1, there is shown, in addition, an input microstrip conductor means 29 and an output microstrip conductor means 30. The microstrip conductor means 29 comprises the usual microstrip conductor having a metallic ground plane 31 bonded to the heat sink 19 and a dielectric separating member 32 and an upper conductor strip 33 which is bonded to the input conductor 13 of the transistor. Similarly, the microstrip conductor means 30 comprises a thin metallic ground member 34 bonded to the heat sink member 19 a dielectric member 35 and an upper thin metallic conductor 36 which is connected to the output conductor 14 of the transistor by any conducting means such as lead 37. Because of the parasitic inductances existing by virtue of the ground plane conductors 31 and 34 and of the microstrip members 28 and 29, the input and output ground circuit of the transistor must be connected as shown by the inductor $L_{11}$ of FIG. 3. It is not necessary that the microstrip conductor means be bonded to the heat sink. If desired, the microstrip conductor means may be separated from the heat sink by an insulating member. There will, however, still be an impedance connecting the microstrip grounds because of the parasitic transmission lines between the microstrip grounds and the heat sink.

In the instance where the parasitic inductive effects of the input and output microstrip conductor means together with that of the heat sink member 19 can be ignored, which is to say that the inductive member $L_{11}$ of FIG. 3 can be ignored, the common lead inductance comprises the inductive members $L_1$, $L_2$, $L_5$, $L_6$ and $L_7$ of FIGS. 1-3. The current from the emitter 11e of the transistor 11 where the transistor is in the common circuit, although it may be in a common base circuit as well, the common current through conductor 38 divides and part flows through $L_1$ and $L_2$ and through $L_3$ to the output and the other part flows through $L_5$ and $L_6$. That current which flows through $L_6$ again can divide and part flow through $L_{10}$ to the input ground circuit and part through $L_7$ which is the ground conductor between the input and output portions of the ground lead to the output ground $L_3$. It is that portion of the common current, whether of common emitter or common base, flowing through $L_5$ and $L_6$ which is of greater concern insofar as common lead inductive effects are concerned and also the current through the inductive component $L_7$.

Efforts in the past, dealing with these common lead inductive effects, have not been completely successful. One of these attempts is that dealt with in the Kraybill U.S. Pat. No. 4,042,952 which places a gap between the input ground and the output ground portions of the ground conductor and, if necessary, places small jumper wires across the gap in order to control, if not eliminate, the inductive member L7. As can be seen by viewing FIG. 3, eliminating L7 and L11 eliminates all common lead inductance since only output current flows through L1 and L2 and only input current flows through L5 and L6.

While the device in FIG. 3 is shown in the common emitter configuration, it may as well be operated in the common base configuration.

In the circuit as illustrated in FIG. 3, the phase angle between the input current through L8 and L9 and the current through L6, becomes a function of the tuning of the circuit comprising the inductance L4 the capacitor 12, the input impedance of the transistor 11 and the inductance L5. Thus, the common lead inductive effect of L6 is a function of the tuning of the tank circuit (capacitor 12, L4, L5 and the device 11).

Figure 5:
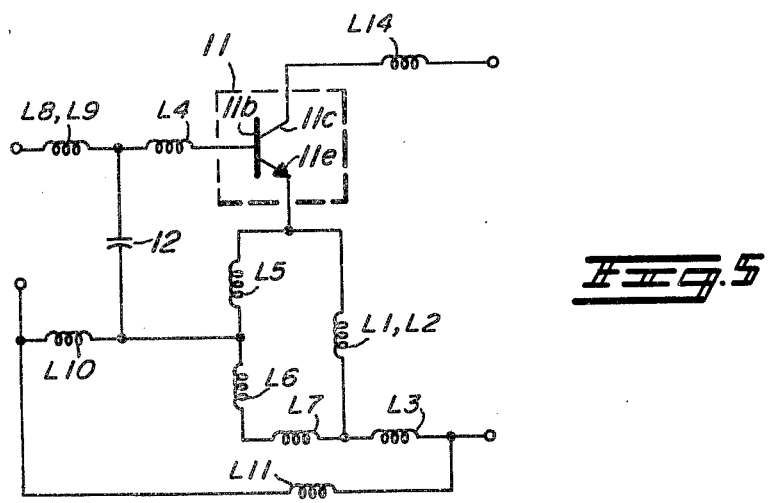
FIG. 5 is a circuit diagram applicable to the structure of FIG. 4.

One solution to this problem according to the invention is illustrated in FIGS. 4 and 5. With this circuit, L6 is not in series with the input circuit so it does not cause any direct feedback effects.

This improved RF power transistor device may be obtained by separating the input ground lead member 16 and the output ground lead member 17 by a gap such as 41 shown in FIG. 4 and connecting by means of wire bonds 42, for example, the ground conductor of capacitor 12 (ground lead member 21) to the input ground lead member 16. Except for the gap 41 between the input ground lead member 16 and the output ground lead 17 the device of FIG. 4 is the same as that of FIG. 1 and corresponding parts have been given the same reference characters. Similarly, the circuit diagram of FIG. 5 which corresponds to the device of FIG. 4 is similar to that of FIG. 3 and, likewise, similar characters have been used. The distinction between the devices of FIGS. 4 and 1 and the circuit diagrams of FIGS. 5 and 3 is that the inductive member L6 which is that portion of the ground lead conductor associated with the ground terminal of the MOS capacitor 12 is now no longer directly a part of the input ground circuit, but rather is more directly a part of the output ground lead circuit. In other words, the position of $L_6$ has been shifted from the input circuit to the output circuit by having the current flowing from the ground terminal of the MOS capacitor to the output ground conductor and the return current on the input side of the device 11 flows directly to the input ground and out through a common portion with the output ground.

Ordinarily L6 is a series feedback element. By moving the connection of L10 from the junction of L6 and L7 (FIG. 3) to the junction of L5 and L6 (FIG. 5) the element L6 is no longer in series with the input and, therefore, has no common lead inductive effects.

Figure 6:
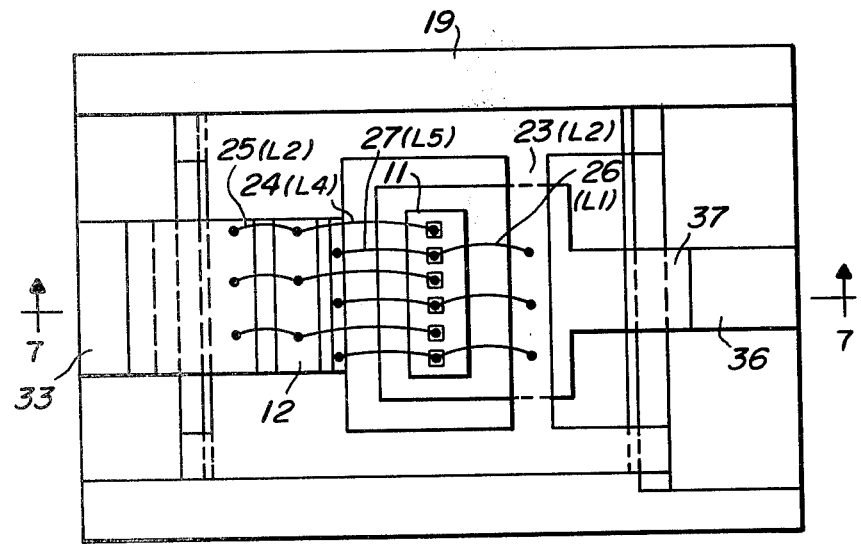
FIG. 6 is a diagrammatic veiw of an RF power transistor device according to the invention.

This solution has one drawback when the entire circuit is considered, that is, one including the parasitic effects of the input and output microstrip conductor lines and due to the coupled heat sink. Due to the parasitic effects of the microstrip ground planes over the heat sink, the input ground and the output ground of the device must be connected, resulting in the full equivalent circuit of FIG. 3 in which L11 is connected into the circuit and also as shown in the circuit of FIG. 8. The structure corresponding to the circuit diagram of FIG. 8 is shown in FIG. 7 in sectional view and top view of the device is shown in FIG. 6. In FIGS. 6, 7 and 8 the transistor is connected in a common base configuration also according to the invention.

In the complete circuit of FIGS. 3 and 5 wherein the microstrip input and output conductors are considered, the input ground inductance L10 becomes part of the common lead inductance with an effect that varies with the tuning of the tank circuit. The solution according to the invention is to make the input ground inductance L10 very small, in effect eliminating it from the circuit. This is done by tight mutual coupling between the input conductor 13 and its inductive effect L9 and the input ground conductor 16 and its inductive effect L10 as more fully explained subsequently. Structurally, it is illustrated in FIGS. 6, 7 and 8 by the addition of the input coupling member 43 which comprises a thin metallic conductor 44 bonded to a very thin dielectric member 45 in turn bonded to another very thin metallic conductor 46 which is part of the input ground conductor and as such is connected to the ground terminal of capacitor 12. The connecting member 43 comprising the very thin dielectric member 45 which for example may be Kapton or Teflon of the order of one half mil in thickness very tightly mutually couples the input current flowing through the conductor 44 with the input ground current flowing through conductor 46. The inductance of the dielectric material whether Kapton or Teflon or the like is very small and results in a very small value of common lead inductance which depends on the tank circuit tuning.

The portion of the output current that flows through the bottom conductor 46 of the connecting member 43 causes a feedback voltage $j\omega LI$ where L is the inductance of conductor 44, I is the portion of the output current flowing therein and j and $\omega$ have their commonly accepted meanings. This output current portion also induces a feedback voltage $j\omega MI$ in the top conductor 44 of the connecting member 43 where M is the mutual coupling (inductance) between the bottom and top conductors 46 and 44, I is the output current portion as above and j and $\omega$ have their commonly accepted meanings. Since both of these feedback voltages appear in series in the input circuit they can be summed with the result that the net feedback voltage is $j\omega I(L-M)$. Due to the tight coupling L and M are very nearly equal and the resultant feedback voltage is nearly zero.

Since the input inductance (L-M) is reduced to a small value as explained the input Q of the transistor is similarly reduced with consequent improvement in performance particularly at high frequencies.

In the common base mode of FIG. 3, L6 looks like a negative resistance below the tank circuit resonance. This negative resistance means that power is fed back from the output to the input which tends to increase the gain below resonance. This feedback, however, also causes the input impedance to vary rapidly with frequency. Above the tank circuit's resonance, L6 looks like a positive resistance, meaning that power is fed from the input to the output which results in reduced gain and an impedance that varies more slowly with frequency. Due to the large impedance variations below the tank circuit's resonance, the device is generally operated above the tank circuit's resonance with reduced gain. Also in the common base mode, the component L5 of common lead inductance acts to increase the transistor gain which is not a function of input tank circuit tuning. Hence, the inductive effect of L5 is not desired to be eliminated in some cases.

The structure of the RF hybrid transistor device as shown in FIG. 7, other than it is shown in the common base configuration is the same as that shown in FIGS. 2 and 4 and the same reference characters will be applied to the same parts. Additional descriptive material accordingly will not be given in order to avoid unnecessary duplication. The bottom conductor 46 of the connecting member 43 becomes part of the input ground lead as shown in FIG. 7 and since there is a small length of conductor 46 between the end of connector 43 and capacitor 12, there is a small component of inductance labeled L10′ shown in the circuit diagram of FIG. 8. The same ground lead conductor 46 extends rearwardly and is connected to the wrap around ground plane conductor 31 of the input microstrip conductor means 32. The top conductor 44 of the connecting member 43 is bonded to the input conductor 33 of the microstrip conductor means.

In the structure of FIG. 7 there may be a common metallization between the input ground lead conductor and the output lead conductor without the effect of L6 coming into the common lead circuit as in FIG. 3 because the current which reaches the ground terminal of the capacitor 12 flows directly back through L10′ and the conductor 46 of the connecting member 43. There is no lateral flow of current from the ground terminal of capacitor 12 to the output ground lead and thus no common lead effect from this point. Accordingly, the circuit diagram of FIG. 8, in this respect, in that the inductance L10′ is connected to the ground terminal of capacitor 12 and thus to the juncture of inductors L5 and L6 rather than to the juncture of inductors L6 and L7 as is the case in the circuit diagram of FIG. 3. There could be a gap in the metallization with wire bonds thereacross in the manner of FIG. 4 to eliminate any question of where L10′ is connected.

Referring to FIG. 9, there is shown an embodiment of the invention in which the common lead inductance is reduced by virtue of having an output structure 51 closely coupling the ouput emitter current and the output collector current. The structure of FIG. 9 is shown diagramatically and the circuit diagram applicable thereto is shown at FIG. 10. The same reference characters are used on FIGS. 9 and 10 for the same parts as are shown in FIGS. 1, 2 and 3. Accordingly, the showing in FIGS. 9 and 10 is not as detailed and elaborate as in the earlier figures. Also in FIG. 10 the transistor 11 is shown connected in the common emitter mode and as has been previously pointed out, this is exemplary and the transistor may be, if desired, connected in the common base mode.

The problem to be solved by the construction of FIG. 9 is the same as that of FIGS. 7 and 8 which is to minimize, if not eliminate, the inductive effects of the common lead inductance. This is achieved according to the structure of FIG. 9 by closely coupling the output ground current with the output collector current. By this means the inductive effect of the members L1, L2 and L7 of FIG. 3 have been eliminated. L1 and L2 comprise the inductance of the output emitter conductors 26 (54) and the inductive effect of the bridge member of FIG. 3 which is not present in the structure of FIG. 9. There is no output ground metallization covering the major portion of the output portion of the beryllia dielectric layer 18. The transistor chip 11 is mounted with its collector on the metallization 14′ which is connected by short wire bonds 52 (only one shown) and to the upper metallic layer 53 of the coupling member 51. The emitter (or base) of the transistor chip 11 is connected by means of wire bonds 54 (only one shown) to the bottom metallic film layer 55 of the coupling member 51. The metallic layer 55 is bonded to the beryllia layer 19 as is well understood. Separating the layers 53 and 55 is a thin film of dielectric material which may be of the order of one half mil in thickness. Such material may, as already pointed out be of the types known as Kapton or Teflon.

By virtue of the very close coupling between the metallic layer 55 and the metallic layer 53, the currents flowing in opposite direction in these two members, are very closely coupled to each other, are about 180° out of phase and of about equal amplitude. Accordingly, the inductive effect of the current flowing through the metallic layer 55 is essentially minimized if not totally eliminated. The feedback effects of the components L5, L6 and L10 are minimized by making the output current flow through L1 and the conductor 55 of the coupling member 51 by virtue of the very low inductance of this path as compared to the inductance of the path L5, L6, L10 and L11. Consequently the common lead inductive effect that would exist otherwise as the result of emitter current flowing to ground through the emitter wire bonds and the bridge member of the ground lead structure is minimized. Increased gain in the common emitter operation and increased bandwidth and more stable operation in the common base configuration are achieved by virtue of the structure shown.

In the common emitter configuration L5 decreases the transistor gain over a wide range of frequencies so that its effect is desired to be eliminated.

In the common base operation L5 has the effect of increasing gain over a wide range of frequencies but can also result in unstable operation so that its effect is sometimes desired to be eliminated.

The output from the transistor device of FIG. 9 is the same as that shown in FIG. 3 which is to say a microstrip conductor member 29 is attached to the heat sink 19. The upper conductor 26 of the microstrip is connected to the upper conductor 53 of the coupling member 51 and the lower or ground conductor 34 of the microstrip includes a wrap around ground portion 56 which is bonded to the lower conductor 55 of the coupling member 51.

While not shown there is a similar microstrip structure in the device of FIG. 9 and the input and output microstrip conductors are bonded to the heat sink member 19 thereby providing a common connection illustrated by the inductor L11 in FIG. 10.

The wire bonds 52 are shown in FIG. 10 as comprising an inductance 52 which is a relatively small value because the length of bonds 52 may be very short and the current flowing in these conductors is not significant from the standpoint of common lead inductance because it is in the collector circuit. The wire bonds 54 of FIG. 10 are shown as comprising conductor L1′ of FIG. 10 but this effect is likewise is small and is not significant because the common lead inductances made very small by virtue of the coupling member 51.

While two embodiments have been shown, it will be understood that there may be many others within the scope of the invention.

I claim:

1. An RF hybrid transistor device including an electrically insulating and thermally conducting substrate, a metallic heat sink on which said substrate is mounted, an output metallic member mounted on said substrate, an input metallic member mounted on said substrate, a ground metallic member having input, output and common portions mounted on said substrate, said ground metallic member comprising a pair of spaced apart members, a common member disposed between said spaced apart members and a bridging member disposed between said spaced apart members and spaced upwardly from said substrate, said output metallic member being disposed between said spaced apart members and underneath said bridging member, a transistor having input, output and common regions, the output region of said transistor being mounted on said output metallic member, the common region of said transistor being coupled to said bridge member and to said common member, capacitive means having one terminal coupled to said common member and having its other terminal coupled to the input region of said transistor and to said input metallic member and a pair of thin conductors separated by a thin dielectric material disposed on said heat sink, one of said pair of conductors being connected to said common metallic member and the other of said pair of conductors being connected to the input lead of said transistor, said pair of conductors being closely coupled and the inductive effect of one of said conductors is substantially eliminated by the current flowing in the opposite direction in the other conductor.

2. An RF hybrid transistor device including an electrically insulating and thermally conducting substrate, a metallic heat sink on which said substrate is mounted, an output metallic member mounted on said substrate, an input metallic member, a ground metallic member having input, output and common portions mounted on said substrate, said ground metallic member comprising a pair of spaced apart members, a common member disposed between said spaced apart members and a bridging member disposed between said spaced apart members and spaced upwardly from said substrate, said output metallic member being disposed between said spaced apart members and underneath said bridging member, a transistor having input, output and common regions, the output region of said transistor being mounted on said output metallic member, the common region of said transistor means being coupled to the output portion of said ground metallic member, capacitive means having one terminal coupled to the common member of said grounded metallic member and having its other terminal coupled to the input region of said transistor and to said input metallic member, an input microstrip conductor means mounted on said metallic heat sink means adjacent the input of said transistor, an output microstrip conductor means mounted on said metallic heat sink means adjacent the output of said transistor each of said input and output microstrip conductor means including a ground conductor associated with said heat sink means and the input and output portions of said ground metallic member, and a further conductor coupled, respectively, to the input region and output region of said transistor, and a pair of thin conductors separated by a thin dielectric material, one of said pair of thin conductors being coupled to said common metallic member and to the ground conductor of the input microstrip conductor means and the other of said pair of thin conductors being connected to the input lead of said transistor, said pair of thin conductors being closely coupled and the inductive effect of one of said thin conductors is substantially eliminated by the current in the opposite direction in the other conductor.

* * * * *